(12) United States Patent
Li et al.

(10) Patent No.: US 7,586,239 B1
(45) Date of Patent: Sep. 8, 2009

(54) MEMS VIBRATING STRUCTURE USING A SINGLE-CRYSTAL PIEZOELECTRIC THIN FILM LAYER

(75) Inventors: Sheng-Shian Li, Greensboro, NC (US); Seungbae Lee, Greensboro, NC (US); Kushal Bhattacharjee, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 12/134,483

(22) Filed: Jun. 6, 2008

Related U.S. Application Data

(60) Provisional application No. 60/942,265, filed on Jun. 6, 2007.

(51) Int. Cl.
*H01L 41/08* (2006.01)
(52) U.S. Cl. .................................. 310/328.02; 310/328
(58) Field of Classification Search ............ 310/323.02, 310/328, 330–332
See application file for complete search history.

(56) References Cited

U.S. PATENT DOCUMENTS

| | | | | |
|---|---|---|---|---|
| 4,798,989 | A * | 1/1989 | Miyazaki et al. | 310/328 |
| 5,739,624 | A * | 4/1998 | Kleiman | 310/328 |
| 6,437,486 | B1 * | 8/2002 | Burcsu et al. | 310/358 |
| 6,767,749 | B2 | 7/2004 | Kub et al. | |
| 2003/0006676 | A1 * | 1/2003 | Smith et al. | 310/328 |
| 2005/0035687 | A1 * | 2/2005 | Xu et al. | 310/328 |
| 2006/0082256 | A1 * | 4/2006 | Bibl et al. | 310/328 |
| 2006/0131997 | A1 * | 6/2006 | Kim et al. | 310/328 |

OTHER PUBLICATIONS

Bannon, III, Frank D. et al., "High-Q HF Microelectromechanical Filters," IEEE Journal of Solid-State Circuits, Apr. 2000, pp. 512-526, vol. 35, No. 4, IEEE.

Chandrahalim, Hangky et al., "Channel-Select Micromechanical Filters Using High-K Dielectrically Transduced Mems Resonators," Proceedings of the 19th International IEEE Micro Electro Mechanical Systems Conference, Jan. 22-26 2006, pp. 894-897, IEEE, Istanbul, Turkey.

Feld, David et al., "A High Performance 3.0 mm x 3.0 mm x 1.1 mm Fbar Full Band Tx Filter for U.S. PCS Handsets," Proceedings of the 2002 IEEE Ultrasonics Symposium, pp. 913-918, IEEE.

Ho, Gavin K., "High-Order Composite Bulk Acoustic Resonators," Technical Digest, IEEE International Conference on Micro Electro Mechanical Systems, 2007, IEEE, Kobe, Japan.

(Continued)

*Primary Examiner*—Mark Budd
(74) *Attorney, Agent, or Firm*—Withrow & Terranova, P.L.L.C.

(57) ABSTRACT

The present invention relates to a micro-electro-mechanical systems (MEMS) vibrating structure having dominant lateral vibrations supported by a MEMS anchor system, and includes a single-crystal piezoelectric thin-film layer that has been grown with a specific crystal orientation. Since the MEMS vibrating structure has dominant lateral vibrations, its resonant frequency may be controlled by its size and shape, rather than layer thickness, which provides high accuracy and enables multiple resonators having different resonant frequencies on a single substrate.

27 Claims, 14 Drawing Sheets

OTHER PUBLICATIONS

Hsu, Wan-Thai et al., "Stiffness-Compensated Temperature-Insensitive Micromechanical Resonators," Technical Digest, IEEE International Conference on Micro Electro Mechanical Systems, 2002, pp. 731-734, IEEE, Las Vegas, NV.

Kim, Bongsang et al., "Frequency Stability of Wafer-Scale Encapsulated MEMS Resonators," Proceedings of the 13th International Conference on Solid-State Sensors, Actuators and Microsystems, Jun. 5-9, 2005, IEEE, Seoul, Korea.

Li, Sheng-Shian et al., "Micromechanical 'Hollow-Disk' Ring Resonators," Technical Digest, IEEE International Conference on Micro Electro Mechanical Systems, 2004, pp. 821-824, IEEE, Maastricht, The Netherlands.

Li, Sheng-Shian et al., "Self-Switching Vibrating Micromechanical Filter Bank," Proceedings of the Joint IEEE Int. Frequency Control/ Precision Time & Time Interval Symposium, Aug. 29-31, 2005, pp. 135-141, IEEE, Vancouver, Canada.

Liu, Xiaoyan et al., "Nanoscale Chemical Etching of Near-Stoichiometric Lithium Tantalate," Journal of Applied Physics, 2005, pp. 064308-1 to 064308-4, vol. 97, American Institute of Physics.

Majjad, H. et al,"Low Temperature Bonding of Interface Acoustic Waves Resonators on Silicon Wafers," Proceedings of the 2005 IEEE Ultrasonics Symposium, 2005, pp. 1307-1310, IEEE.

Osugi, Yukihisa et al., "Single Crystal FBAR with LiNbO3 and LiTaO3 Piezoelectric Substance Layers," Proceedings of the International Microwave Symposium Jun. 3-8, 2007, pp. 873-876, IEEE, Honolulu, Hawaii.

Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, Apr. 2007, pp. 870-876, vol. 54, No. 4, IEEE.

Piazza, G. et al., "Low Motional Resistance Ring-Shaped Contour-Mode Aluminum Nitride Piezoelectric Micromechanical Resonators for UHF Applications," Proceedings of the 18th International IEEE Micro Electro Mechanical Systems Conference, Jan. 30 - Feb. 3, 2005, pp. 20-23, IEEE, Miami, Florida.

Stephanou, P.J. et al., "GHz contour Extensional Mode Aluminum Nitride MEMS Resonators," Proceedings of the 2006 IEEE Ultrasonics Symposium, 2006, pp. 2401-2404, IEEE.

Stephanou, P.J. et al., "GHz Higher Order Contour Mode AlN Annular Resonators," Technical Digest of the IEEE International Conference on Micro Electro Mechanical Systems, 2007, IEEE, Kobe, Japan.

Wang, Jing et al., "1.14-GHz Self-Aligned Vibrating Micromechanical Disk Resonator," Technical Digest of the 2003 Radio Frequency Integrated Circuits Symposium, Jun. 8-10, 2003, pp. 335-338, IEEE, Philadelphia, Pennsylvania.

Wong, Ark-Chew et al., "Micromechanical Mixer-Filters ('Mixlers')," Journal of Microelectromechanical Systems, Feb. 2004, pp. 100-112, vol. 13, No. 1, IEEE.

* cited by examiner

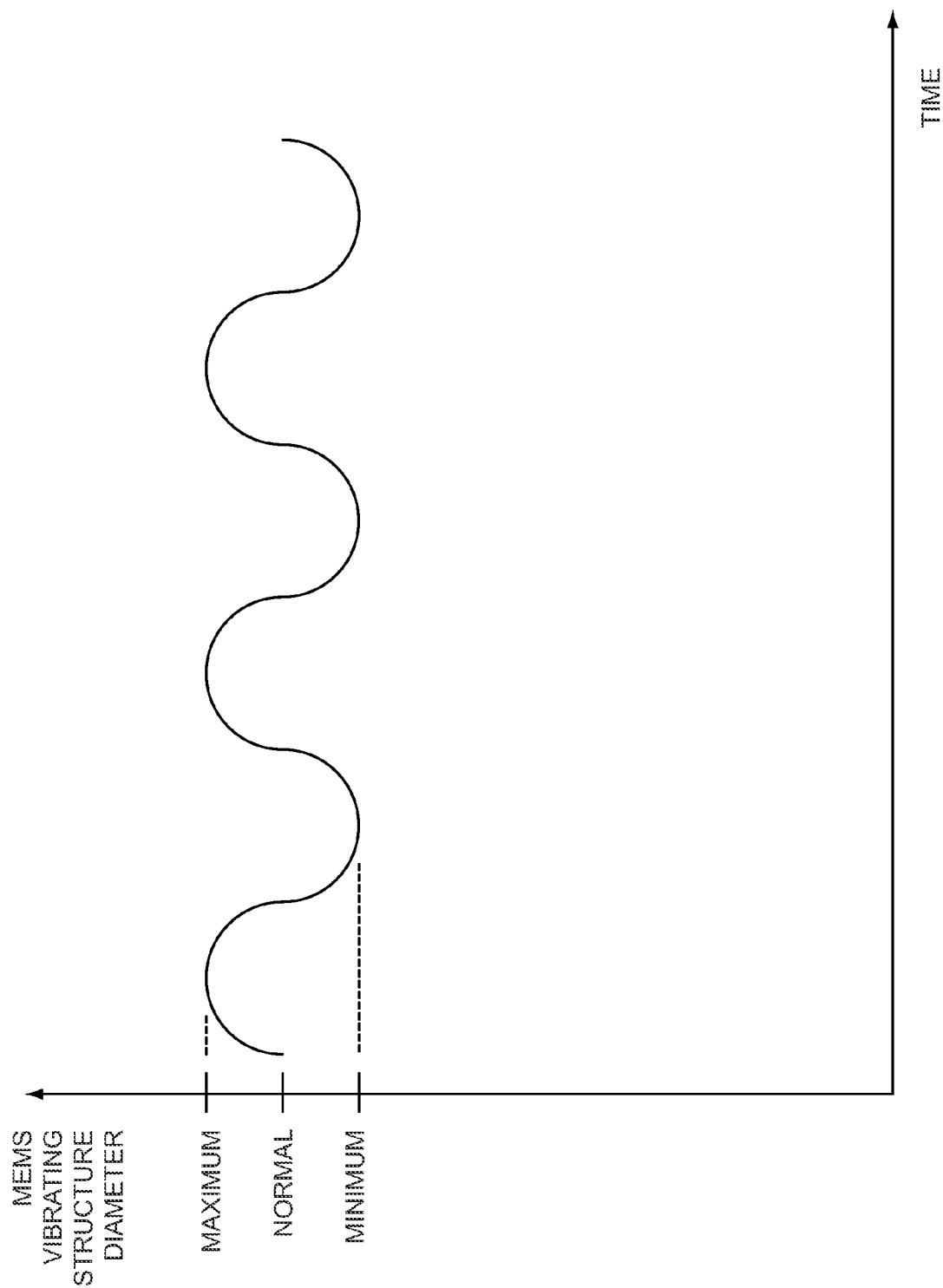

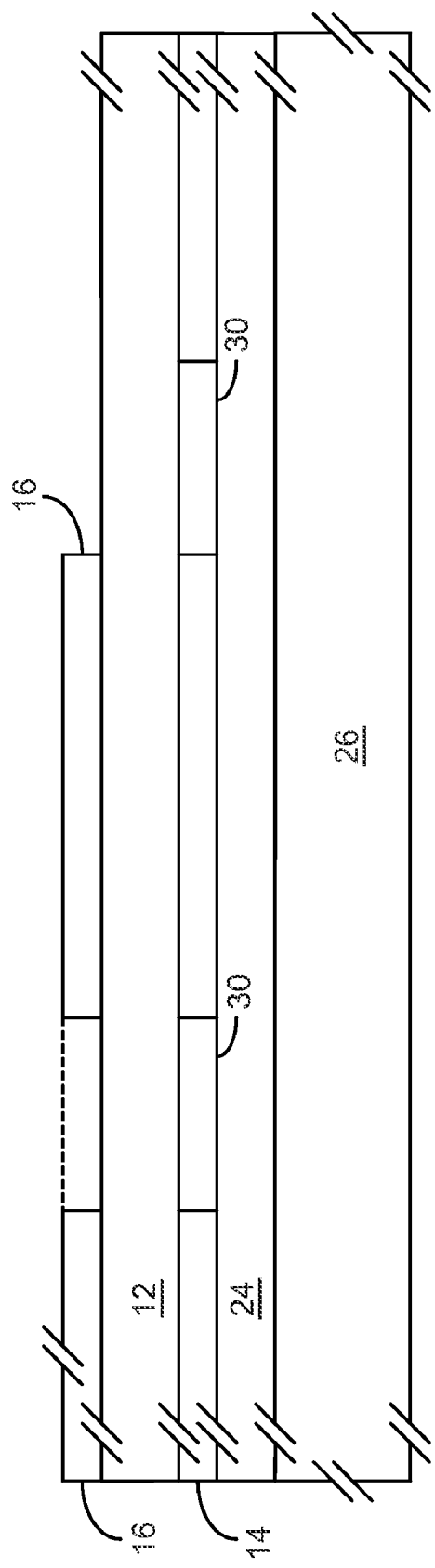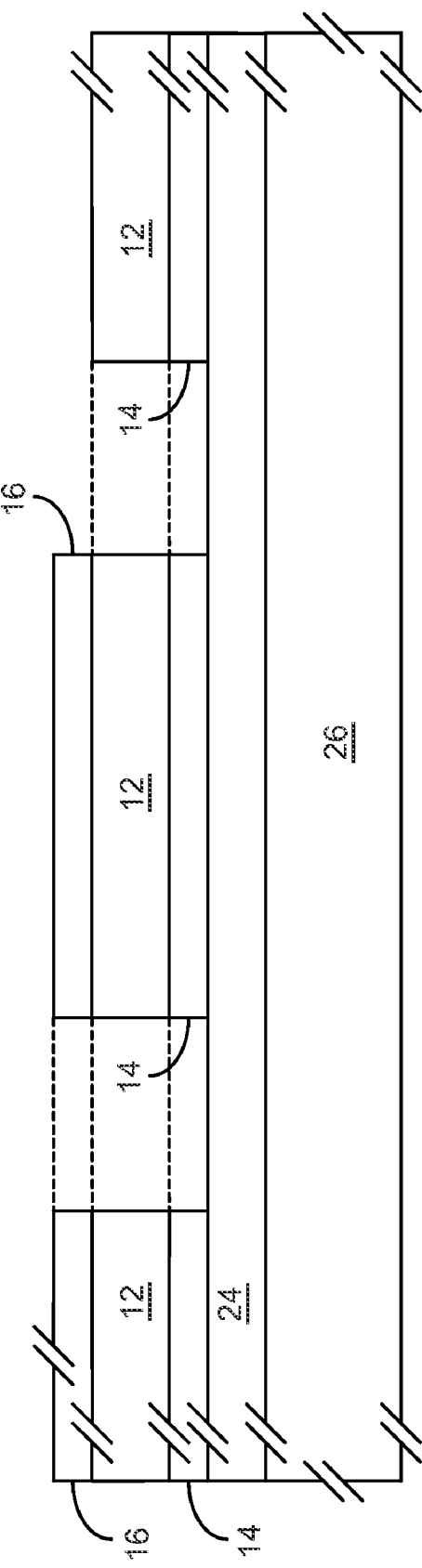

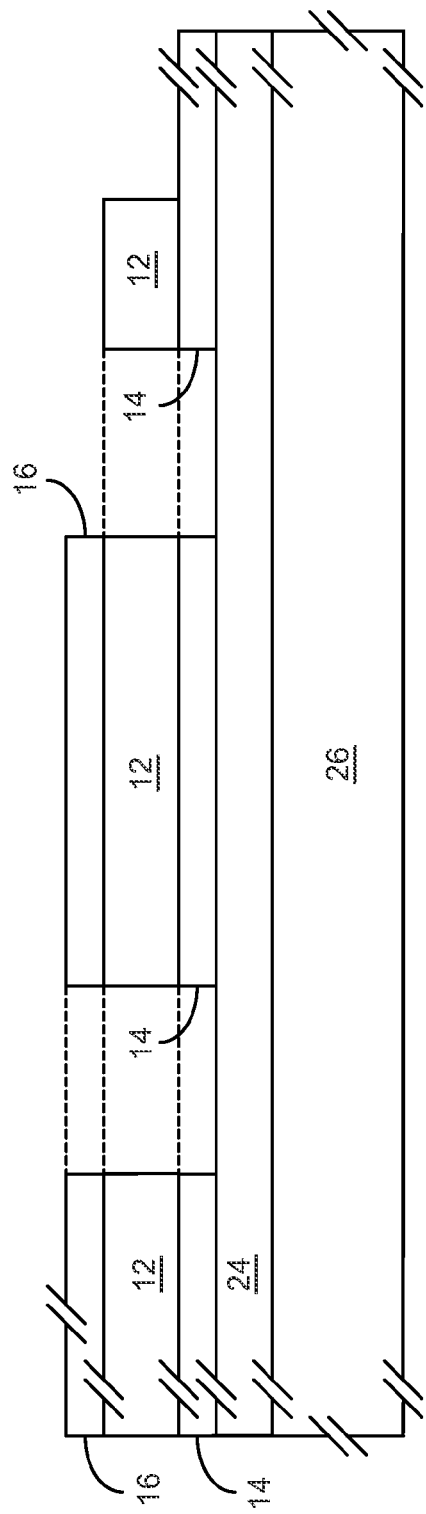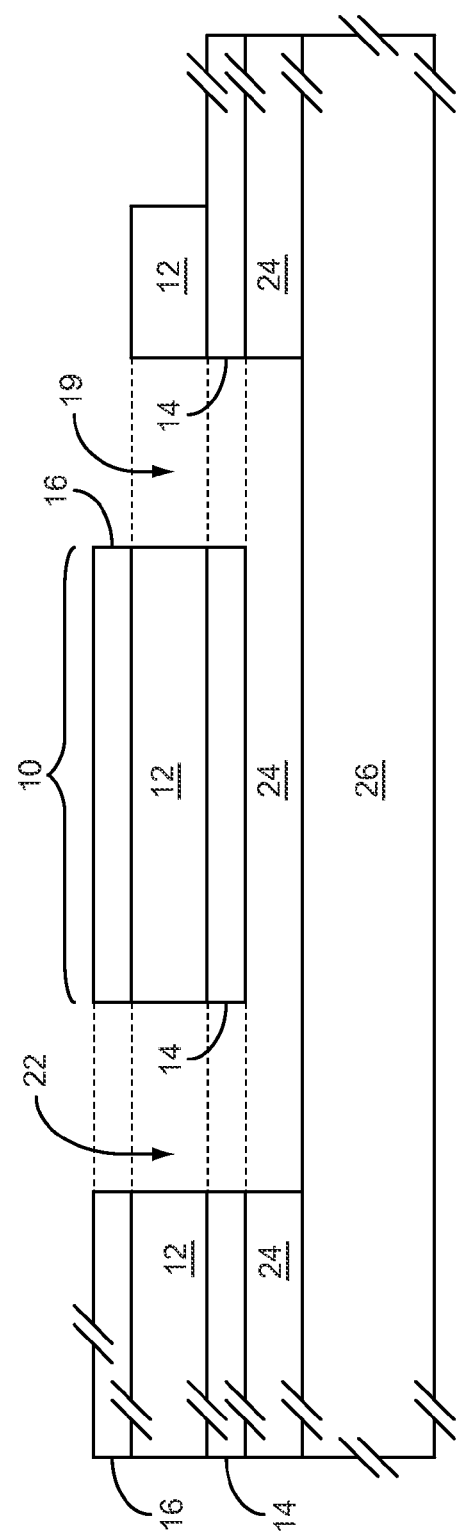

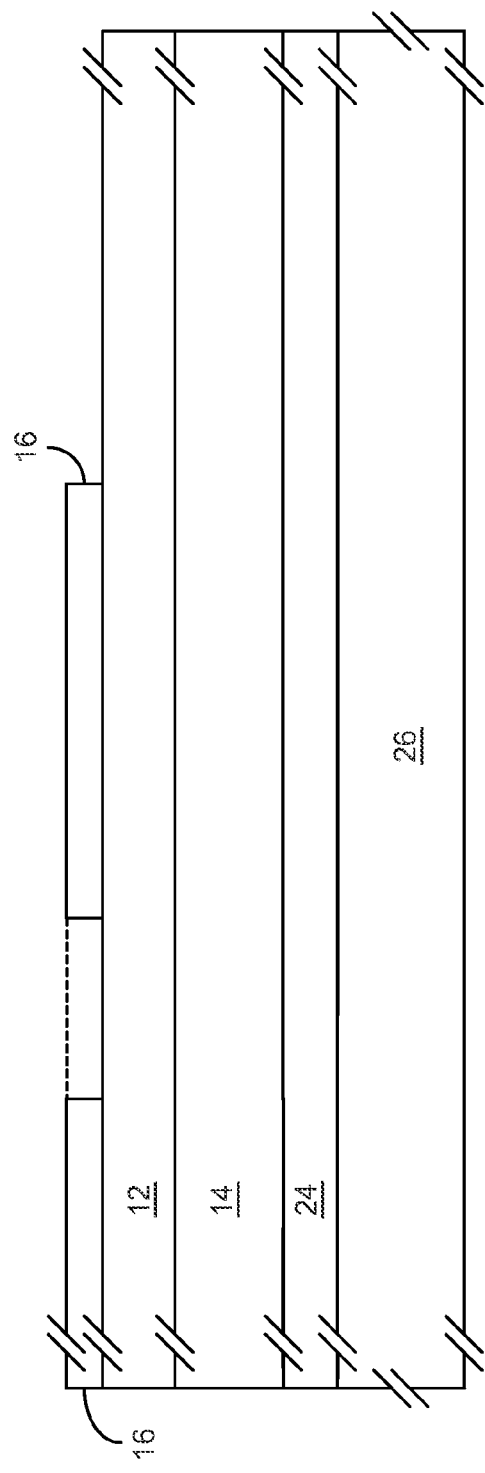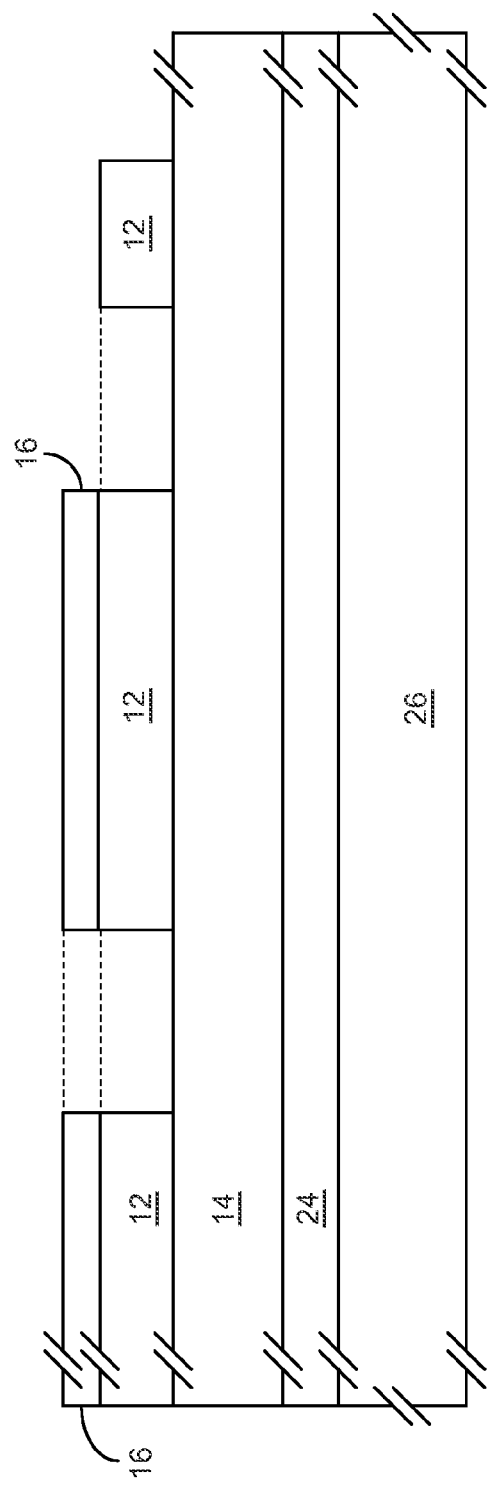

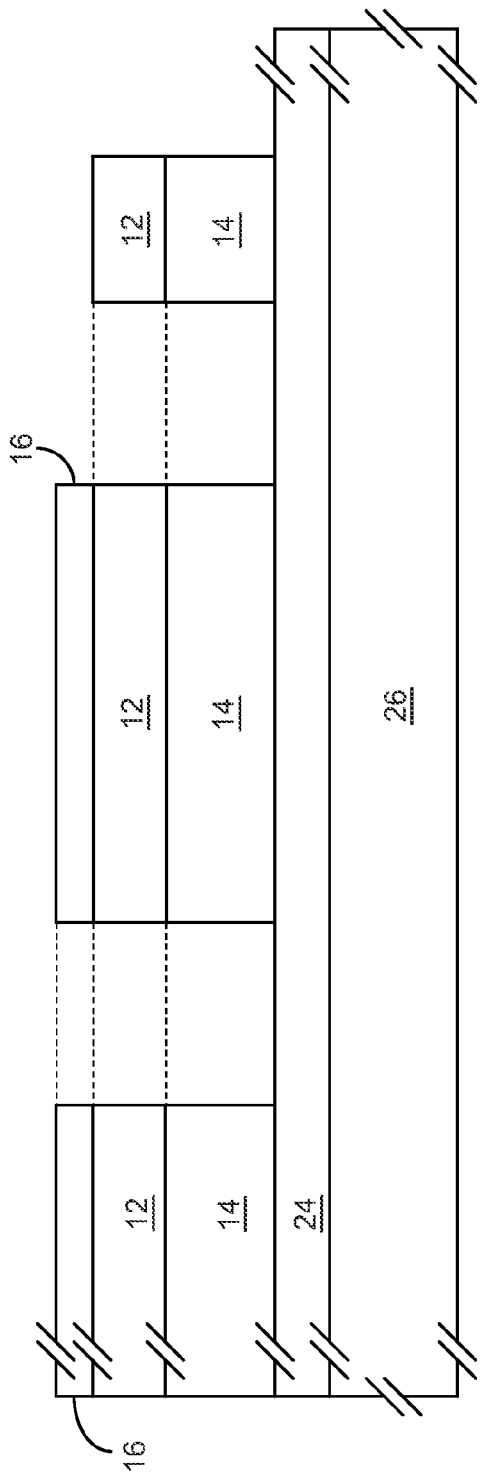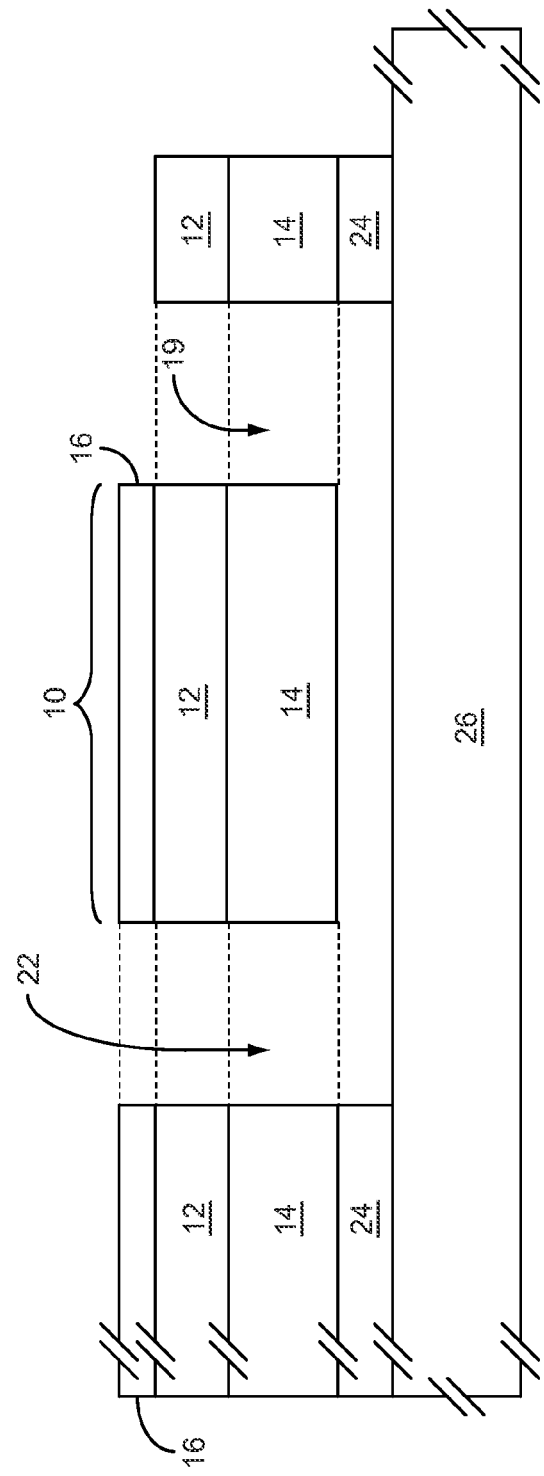

MEMS VIBRATING STRUCTURE USING A SINGLE-CRYSTAL PIEZOELECTRIC THIN FILM LAYER

This application claims the benefit of provisional patent application Ser. No. 60/942,265, filed Jun. 6, 2007, the disclosure of which is hereby incorporated herein by reference in its entirety.

FIELD OF THE INVENTION

Embodiments of the present invention relate to microelectromechanical systems (MEMS) vibrating structures, such as MEMS sensors, MEMS resonators, MEMS oscillators, or MEMS filters, which may be used in radio frequency (RF) communications systems.

BACKGROUND OF THE INVENTION

Resonators are devices that are often used in RF circuitry in frequency reference circuits and filter circuits. Generally, resonators need to be high-Q, low loss, stable, have a low temperature coefficient of frequency, have high repeatability, have high accuracy, and have a low motional impedance. Additionally, RF circuits often require multiple resonators having different resonant frequencies.

One common type of resonator is a thin-film bulk acoustic resonator (FBAR), according to the prior art. An FBAR may use a thin-film piezoelectric material surrounded above and below with conductors. Aluminum Nitride may be deposited as a piezoelectric thin-film material; however, the FBAR may predominantly resonate in a thickness mode. Therefore, a resonant frequency of the FBAR may be dependent upon the thickness of a deposited Aluminum Nitride layer, which may be difficult to control. Additionally, a separate Aluminum Nitride layer may be needed for an additional FBAR having a different resonant frequency, which may be limiting or expensive.

An improvement on a traditional FBAR is an FBAR that uses a grown single-crystal FBAR (XBAR), and may have the advantages of good material uniformity, low material defect rates, high material stability, low loss, wide bandwidth, high repeatability, high-Q, and low drift. An alternative to the FBAR is a thin-film piezoelectric-on-substrate resonator (FPOSR), which uses a deposited thin-film, such as zinc oxide on a suspended substrate. The FPOSR may resonate in either a thickness mode or a lateral mode. Lateral vibrations tend to be dependent on the size and shape of the resonator and not dependent upon the thickness of the resonator. However, the deposited thin-film of the FPOSR may have resonant frequency inaccuracies and may have high losses.

A micro-electro-mechanical systems (MEMS) device includes at least one mechanical element, such as a sensor, actuator, or resonator that is formed using a micromachining process that selectively etches away parts of a wafer. The wafer may include added structural layers and may be made of a semiconductor material, such as Silicon. RF communications systems may use MEMS vibrating structures in MEMS resonator or filter circuits. MEMS resonators may be constructed mechanically to provide excellent isolation between an anchor and a vibrating structure, which may provide MEMS resonators with a very high-Q. Thus, there is a need for a MEMS resonator which is high-Q, low loss, stable, has a low temperature coefficient of frequency, has high repeatability, has high accuracy, has a low motional impedance, and has a resonant frequency that is not directly dependent on layer thickness to enable multiple resonators having different resonant frequencies on a single die.

SUMMARY OF THE EMBODIMENTS

The present invention relates to a micro-electro-mechanical systems (MEMS) vibrating structure having dominant lateral vibrations supported by a MEMS anchor system, and includes a single-crystal piezoelectric thin-film layer that has been grown with a specific crystal orientation, or wafer cut. Since the MEMS vibrating structure has dominant lateral vibrations, its resonant frequency may be controlled by its size and shape, rather than layer thickness, which provides high accuracy and enables multiple resonators having different resonant frequencies on a single substrate.

Since the MEMS vibrating structure is formed from a single-crystal material and uses mechanically efficient MEMS construction, it may be high-Q, low loss, stable, have a low temperature coefficient of frequency, have high repeatability, and have a low motional impedance.

The single-crystal piezoelectric thin-film layer has piezoelectric properties, such that an applied alternating current (AC) voltage may cause mechanical vibrations, and the single-crystal piezoelectric thin-film layer may include Lithium Tantalate or Lithium Niobate for their desirable properties. In a first embodiment of the present invention, the single-crystal piezoelectric thin-film layer is sandwiched between two conductive layers, such as metallization layers. The single-crystal piezoelectric thin-film layer is a principal resonating layer and may provide the dominant resonant characteristics of the MEMS vibrating structure. In a second embodiment of the present invention, the single-crystal piezoelectric thin-film layer is sandwiched between two conductive layers; however, one of the conductive layers is the principal resonating layer and may provide the dominant resonant characteristics of the MEMS vibrating structure, and the single-crystal piezoelectric thin-film layer may provide the mechanical drive. In one example of the second embodiment of the present invention, the conductive layer that is the principal resonating layer is a conductive single-crystal semiconductor layer, such as highly-doped Silicon, which may be significantly thicker than the single-crystal piezoelectric thin-film layer. Alternatively, the conducting layer that is the principal resonating layer may include polysilicon, isotropic, or other materials.

The single-crystal piezoelectric thin-film layer may be driven with an AC voltage to operate as a piezoelectric transducer, or may additionally be driven with a direct current (DC) voltage to additionally operate as an electrostatic transducer based on the capacitance established by the single-crystal piezoelectric thin-film layer sandwiched between two conductive layers. An electrostatic transducer requires both AC and DC voltages for proper operation. In a third embodiment of the present invention, the single-crystal piezoelectric thin-film layer is sandwiched between two conductive layers, such as metallization layers, and one of the conductive layers is attached to an additional layer, which serves as the principal resonating layer. The additional layer may be conductive, non-conductive, or semiconductive.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 2 is a graph illustrating how the MEMS vibrating structure diameter varies with time.

Figure 1:
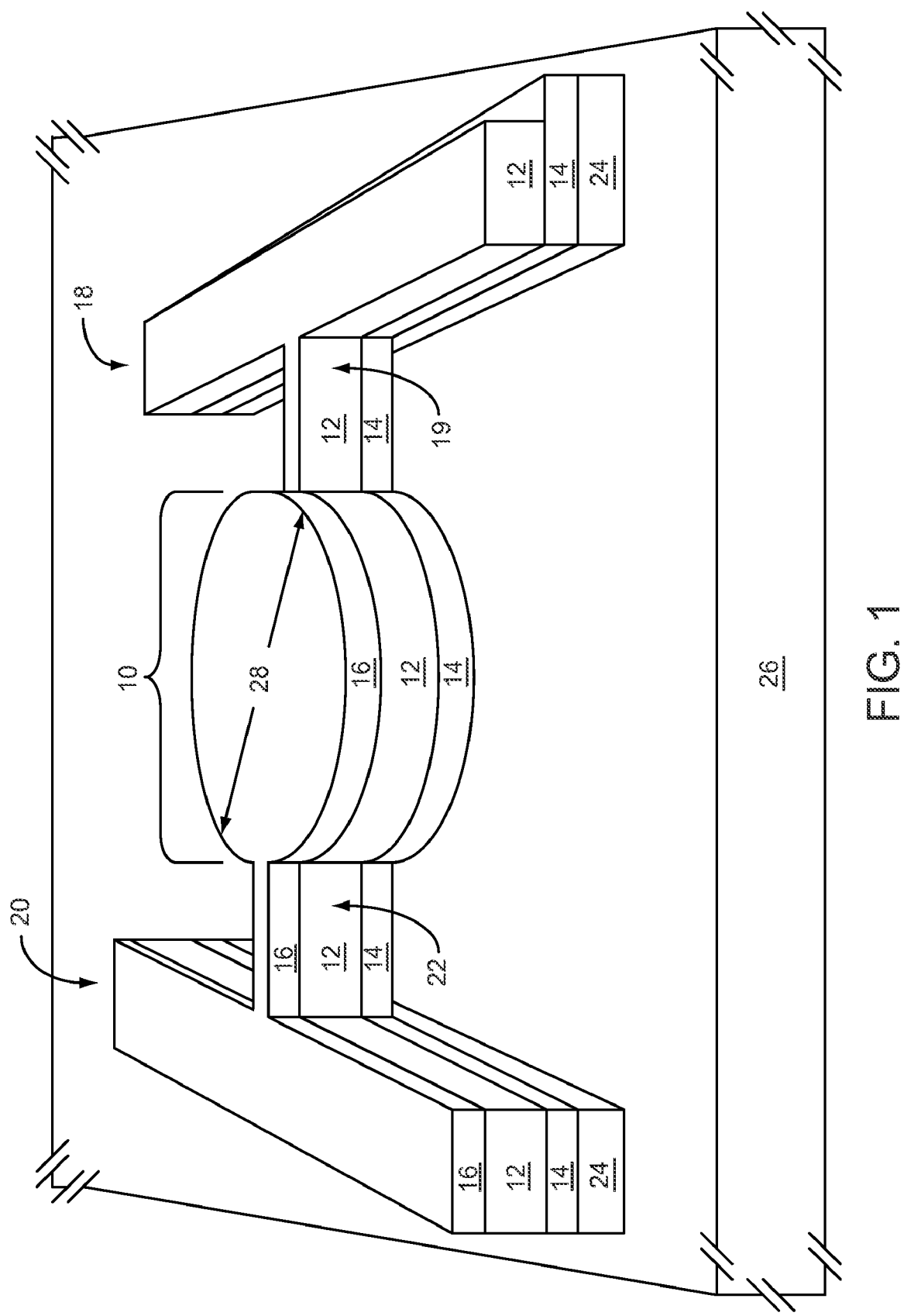
FIG. 1 shows a micro-electro-mechanical systems (MEMS) vibrating structure according to a first embodiment of the present invention. The MEMS vibrating structure includes a single-crystal piezoelectric thin-film layer sandwiched between two conductive layers, such as metallization layers.

FIGS. 3A, 3B, 3C, 3D, 3E, and 3F show how a substrate and its layers are used to form the MEMS vibrating structure illustrated in FIG. 1, according to an exemplary embodiment of the present invention.

Figure 4:
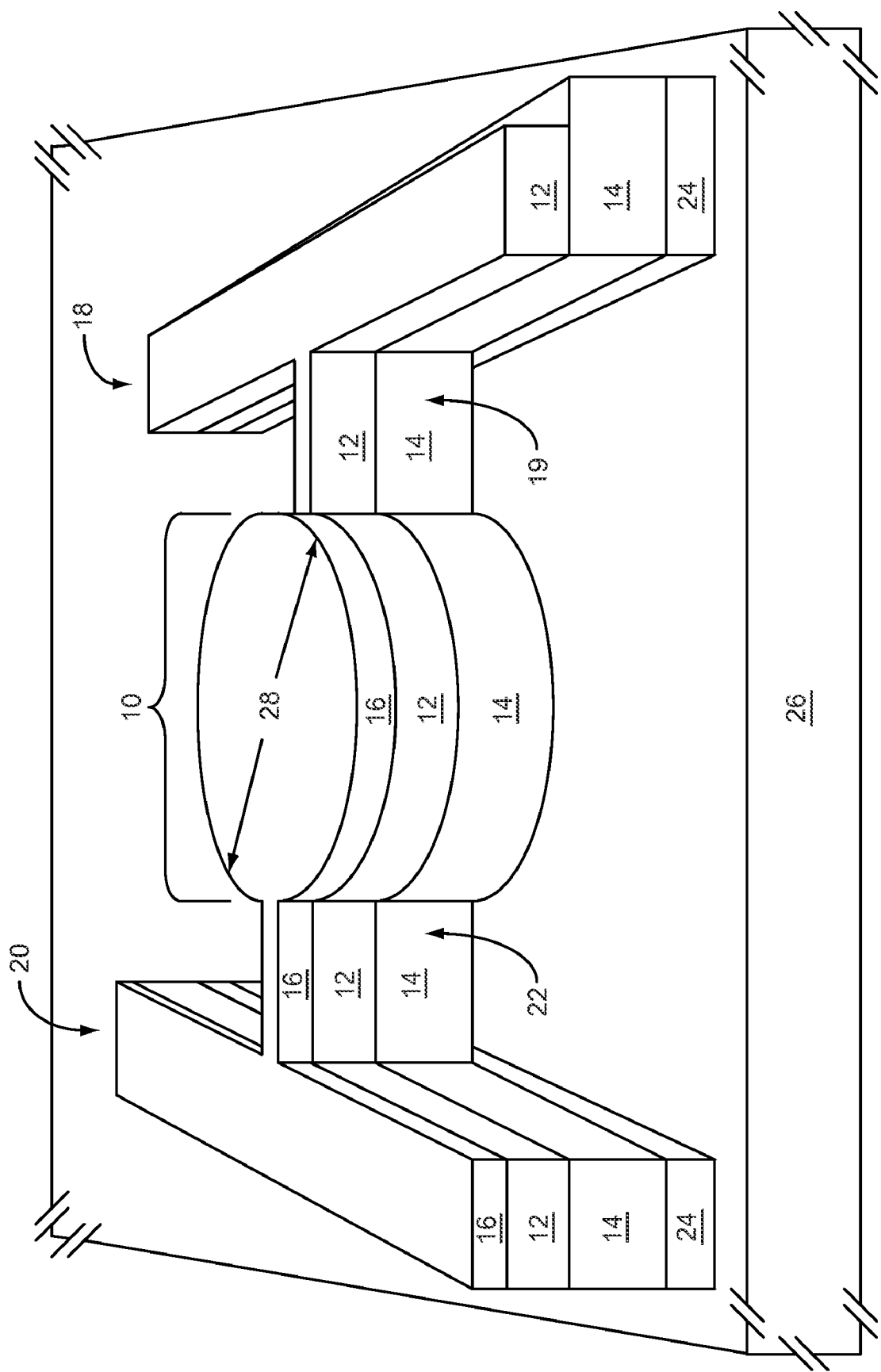

FIG. 4 shows a MEMS vibrating structure according to a second embodiment of the present invention. The MEMS vibrating structure includes a single-crystal piezoelectric thin-film layer sandwiched between two conductive layers, such that one of the conductive layers is the principal resonating layer.

FIGS. 5A, 5B, 5C, 5D, 5E, and 5F show how a substrate and its layers are used to form the MEMS vibrating structure illustrated in FIG. 4, according to an exemplary embodiment of the present invention.

Figure 6:
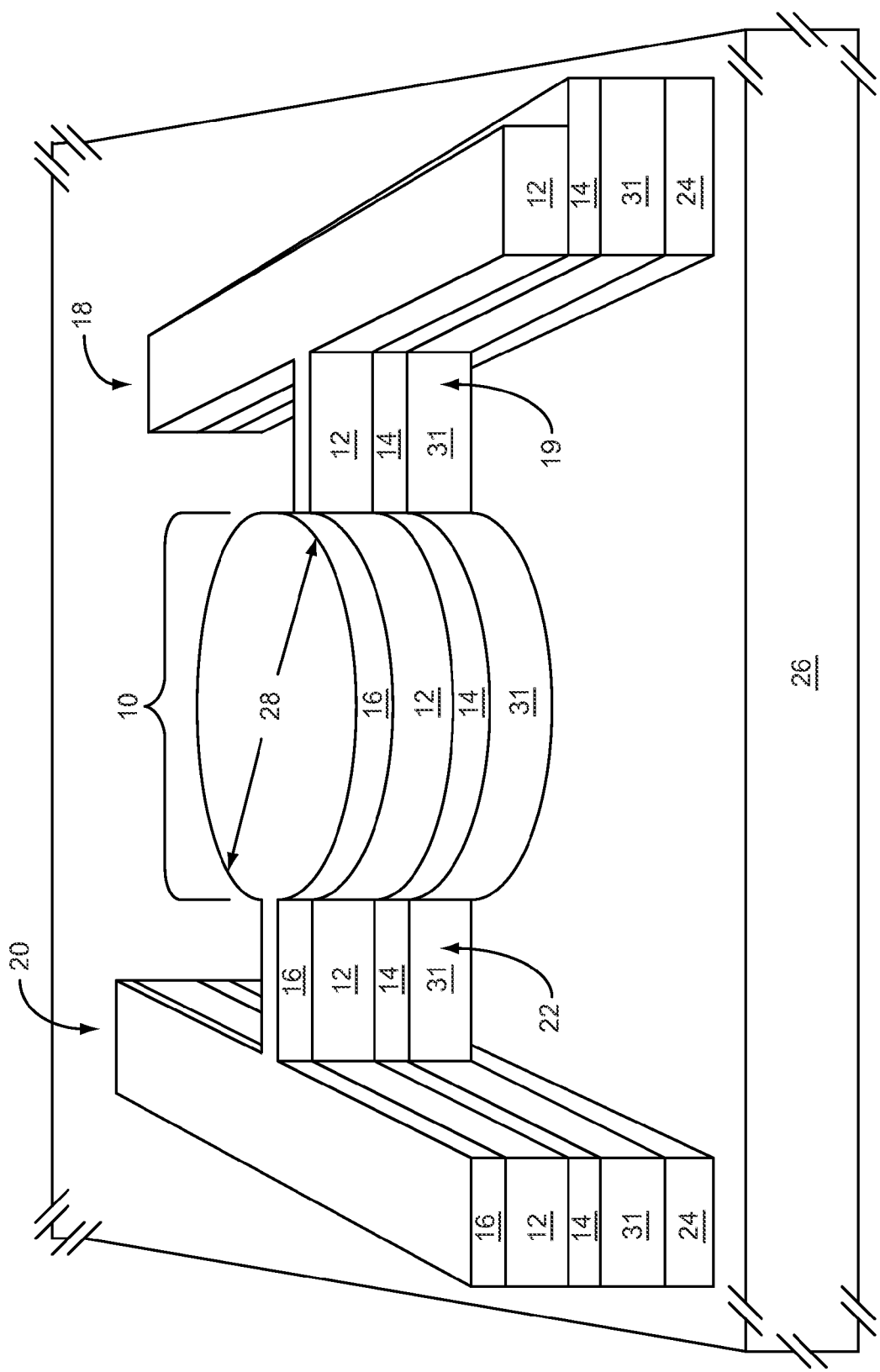

FIG. 6 shows a MEMS vibrating structure according to a third embodiment of the present invention. The MEMS vibrating structure includes a single-crystal piezoelectric thin-film layer sandwiched between two conductive layers, such that one of the conductive layers is attached to an additional layer, which is the principal resonating layer.

Figure 7:
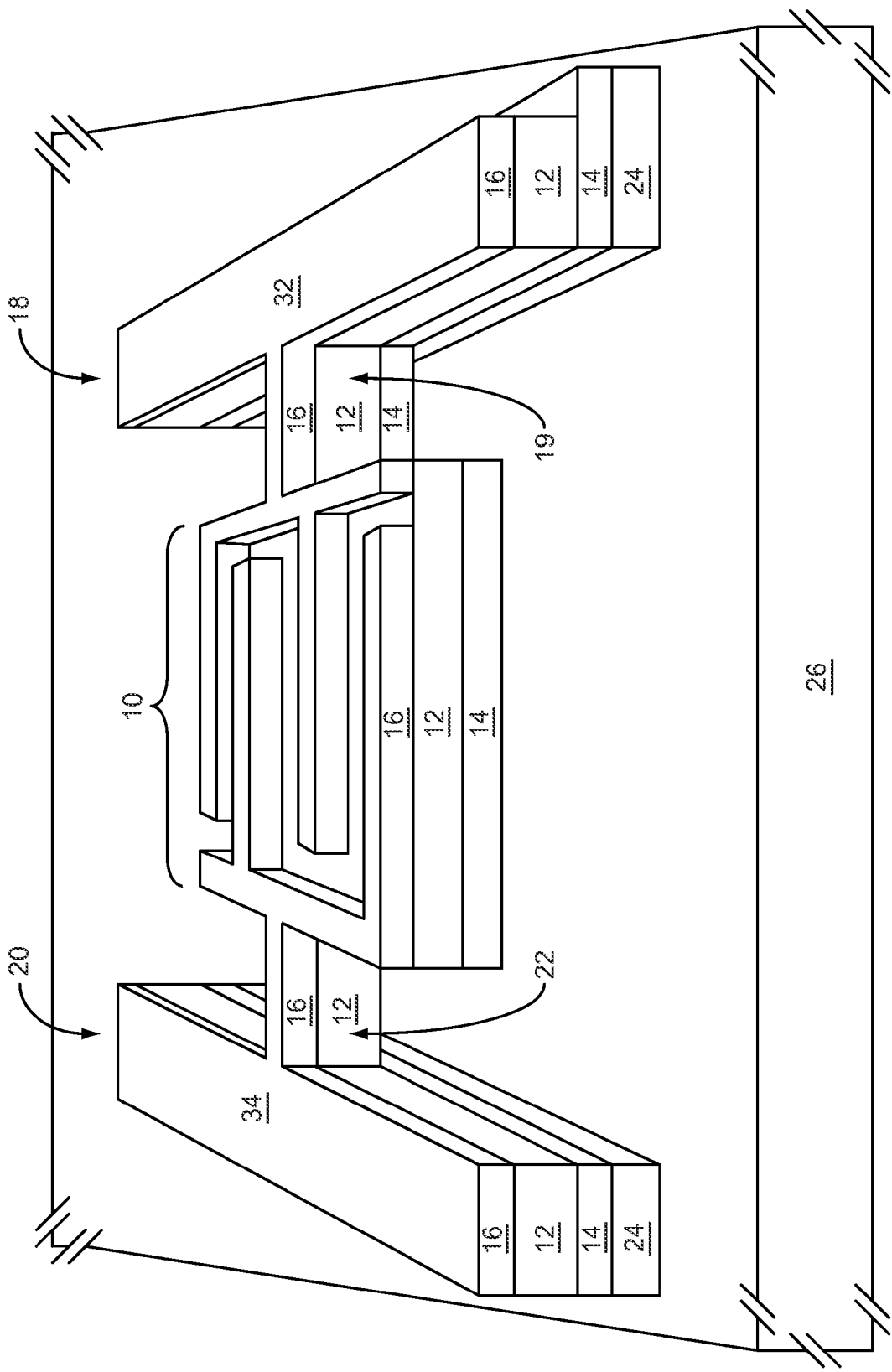

FIG. 7 shows a MEMS vibrating structure according to an alternate embodiment of the present invention.

Figure 8:
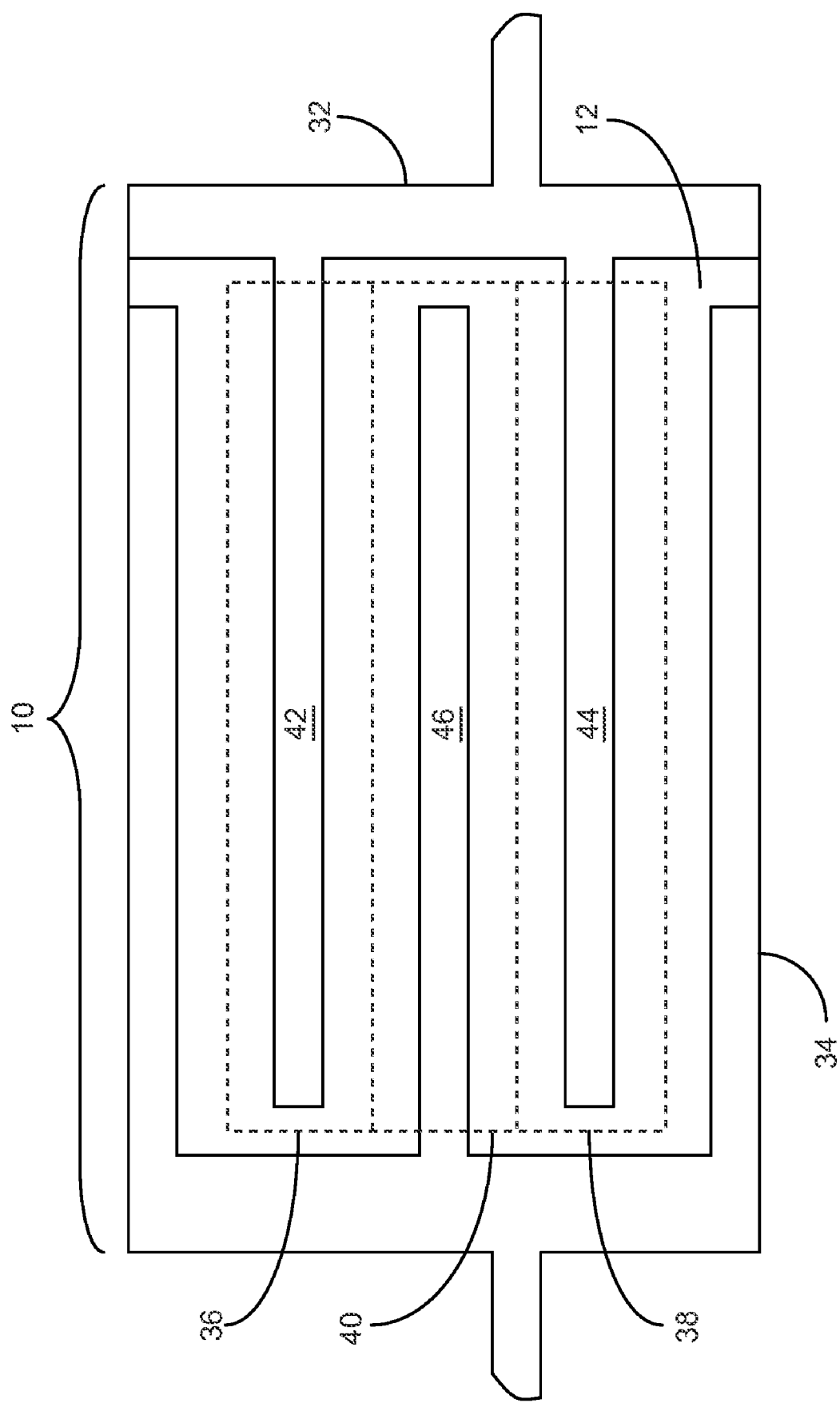

FIG. 8 shows a top view of the MEMS vibrating structure illustrated in FIG. 7.

Figure 9:
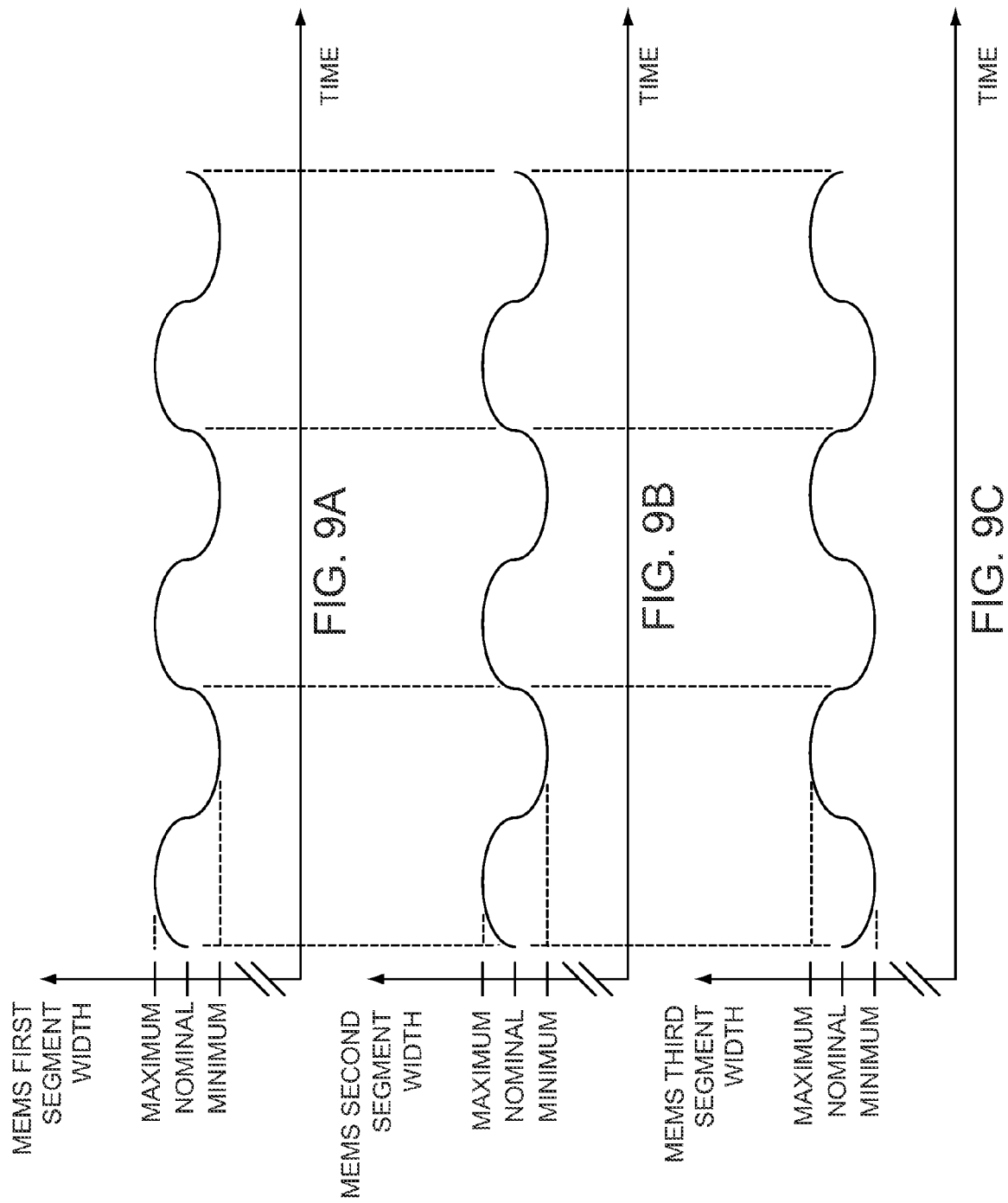

FIGS. 9A, 9B, and 9C are graphs illustrating how MEMS first, second, and third segment widths vary with time.

Figure 10:
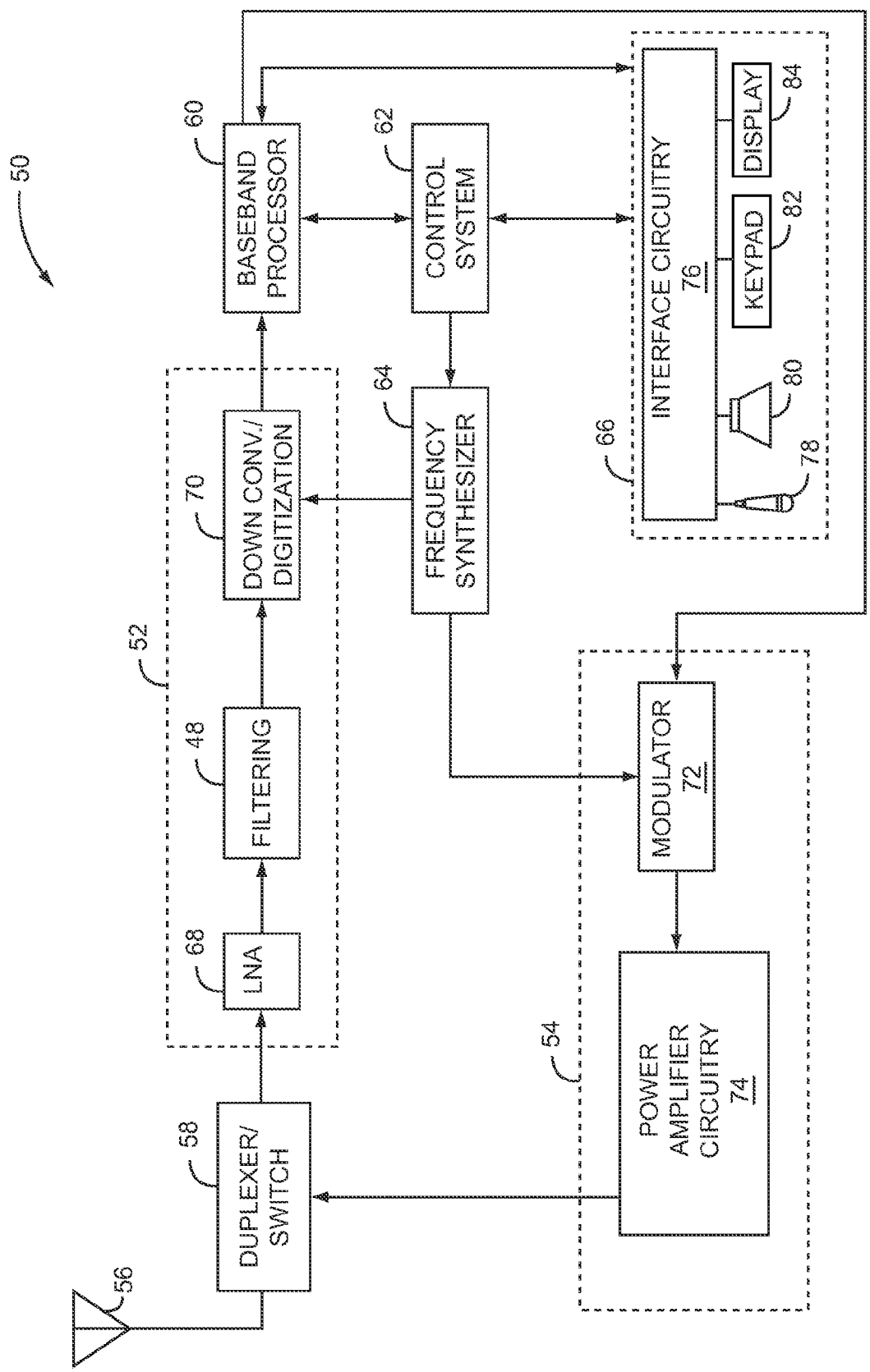

FIG. 10 shows an application example of the present invention used in a mobile terminal.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a micro-electro-mechanical systems (MEMS) vibrating structure having dominant lateral vibrations supported by a MEMS anchor system, and includes a single-crystal piezoelectric thin-film layer that has been grown with a specific crystal orientation. Since the MEMS vibrating structure has dominant lateral vibrations, its resonant frequency may be controlled by its size and shape, rather than layer thickness, which provides high accuracy and enables multiple resonators having different resonant frequencies on a single substrate.

Since the MEMS vibrating structure is formed from a single-crystal material and uses mechanically efficient MEMS construction, it may be high-Q, low loss, stable, have a low temperature coefficient of frequency, have high repeatability, and have a low motional impedance.

The single-crystal piezoelectric thin-film layer has piezoelectric properties, such that an applied alternating current (AC) voltage may cause mechanical vibrations, and the single-crystal piezoelectric thin-film layer may include Lithium Tantalate or Lithium Niobate for their desirable properties. In a first embodiment of the present invention, the single-crystal piezoelectric thin-film layer is sandwiched between two conductive layers, such as metallization layers. The single-crystal piezoelectric thin-film layer is a principal resonating layer and may provide the dominant resonant characteristics of the MEMS vibrating structure. In a second embodiment of the present invention, the single-crystal piezoelectric thin-film layer is sandwiched between two conductive layers; however, one of the conductive layers is the principal resonating layer and may provide the dominant resonant characteristics of the MEMS vibrating structure, and the single-crystal piezoelectric thin-film layer may provide the mechanical drive. In one example of the second embodiment of the present invention, the conductive layer that is the principal resonating layer is a conductive single-crystal semiconductor layer, such as highly-doped Silicon, which may be significantly thicker than the single-crystal piezoelectric thin-film layer. Alternatively, the conducting layer that is the principal resonating layer may include polysilicon, isotropic, or other materials.

The single-crystal piezoelectric thin-film layer may be driven with an AC voltage to operate as a piezoelectric transducer, or may additionally be driven with a direct current (DC) voltage to additionally operate as an electrostatic transducer based on the capacitance established by the single-crystal piezoelectric thin-film layer sandwiched between two conductive layers. An electrostatic transducer requires both AC and DC voltages for proper operation. In a third embodiment of the present invention, the single-crystal piezoelectric thin-film layer is sandwiched between two conductive layers, such as metallization layers, and one of the conductive layers is attached to an additional layer, which serves as the principal resonating layer. The additional layer may be conductive, non-conductive, or semiconductive.

Crystals which acquire a charge when compressed, twisted, or distorted are said to be piezoelectric. This property provides a transducer effect between electrical and mechanical oscillations or vibrations. In a piezoelectric transducer, an applied AC voltage will cause mechanical vibrations in the transducer, which will present an impedance response, which may be called a motional impedance, to the circuitry providing the AC voltage that is dependent on mechanical resonances in the piezoelectric transducer. The impedance response is called a motional impedance. Additionally, the piezoelectric transducer will present an impedance response, called an electrical impedance, to the circuitry providing the AC voltage that is based on the electrical characteristics of the piezoelectric transducer. The motional impedance and the electrical impedance combine to provide a total impedance presented to the circuitry providing the AC voltage.

Similar to a piezoelectric transducer is an electrostatic transducer. In a piezoelectric transducer, charges in a piezoelectric material are produced from mechanical movements in the piezoelectric material. In an electrostatic transducer, charges in a dielectric material, which is enclosed on either side with conducting materials to form a capacitor, are produced from an applied DC voltage across the material. Mechanical vibrations in the transducer will vary the capacitance of the transducer, which will present an impedance response to the circuitry providing the DC voltage across the material that is dependent on mechanical vibrations in the transducer.

If a piezoelectric transducer and an electrostatic transducer are combined into a single transducer using a common crystal material, then the single transducer will have a piezoelectric impedance that is dependent on mechanical properties of the transducer and the frequency and magnitude of an AC voltage applied across the transducer, and an electrostatic impedance that is dependent on mechanical and electrical properties, such as dielectric constant, of the transducer and the magnitude of a DC voltage applied across the transducer. The DC voltage could be varied to fine tune the piezoelectric impedance. Additionally, the DC voltage could be modulated with a low frequency signal that is effectively mixed with the AC voltage.

FIG. 1 shows a micro-electro-mechanical systems (MEMS) vibrating structure 10 according to a first embodiment of the present invention. The MEMS vibrating structure 10 includes a grown single-crystal piezoelectric thin-film layer 12 that is sandwiched between a first conducting layer 14 and a second conducting layer 16. A first supporting structure includes a first anchor 18 and a first mechanical support member 19 between the MEMS vibrating structure 10 and the first anchor 18. A second supporting structure includes a second anchor 20 and a second mechanical support member 22 between the MEMS vibrating structure 10 and the second anchor 20. An insulating layer 24 is located over a substrate 26 and may be etched to provide attachment points for the first and second anchors 18, 20. The first supporting structure includes the first conducting layer 14 and the grown single-crystal piezoelectric thin-film layer 12. The MEMS vibrating structure 10 is suspended between the first and second anchors 18, 20. In alternate embodiments of the present invention, the MEMS vibrating structure 10 may be suspended between three or more anchors.

The grown single-crystal piezoelectric thin-film layer 12 has a wafer cut and is a single-crystal layer that may have been cut from a boule that was grown with a specific crystal orientation. The wafer cut, such as Z-cut, Y-cut, or any rotated cut, the shape, and the thickness of the grown single-crystal piezoelectric thin-film layer 12 in the MEMS vibrating structure 10 may determine its vibrational characteristics. The wafer material also may determine vibrational characteristics. Different vibrational characteristics may be used for different applications, such as resonators, oscillators, filters, or sensors.

One vibrational characteristic is resonant frequency. The grown single-crystal piezoelectric thin-film layer 12 in the MEMS vibrating structure 10 may have at least one resonant region having at least one resonant frequency. Other vibrational characteristics are electromechanical coupling coefficients, which relate the mechanical characteristics to the electrical characteristics of the MEMS vibrating structure 10, and may be useful for RF filter applications or high-Q RF circuits. Another vibrational characteristic is the dominant mode of vibration. In a disk-shaped MEMS vibrating structure 10, as illustrated in FIG. 1, a d33 mode of vibration is a thickness mode of vibration, wherein the thickness of the MEMS vibrating structure 10 varies as the MEMS vibrating structure 10 vibrates. A d31 mode of vibration is a radial mode of vibration, which is one form of lateral vibration, wherein a MEMS vibrating structure diameter 28 varies as the MEMS vibrating structure 10 vibrates. In the present invention, during a first active state, the MEMS vibrating structure 10 vibrates with dominant lateral vibrations, or a lateral dominant mode of vibration. Other vibrations may exist, but lateral vibrations will dominate. An additional vibrational characteristic is a temperature coefficient of frequency (TCF), which may be minimized using the appropriate wafer cut, wafer material, shape, and thickness of the MEMS vibrating structure 10.

The first active state is entered by applying a driving AC voltage between the first conducting layer 14 and the second conducting layer 16 at the MEMS vibrating structure 10. The dominant lateral vibrations may be caused by a piezoelectric effect produced by the driving AC voltage. A first inactive state exists when no driving AC voltage is applied. Typically, the driving AC voltage may be applied to the first conducting layer 14 on the first anchor 18, which is electrically attached to the first conducting layer 14 on the MEMS vibrating structure 10 through the first conducting layer 14 on the corresponding mechanical support member 19, 22. Likewise, the driving AC voltage may be applied to the second conducting layer 16 on the second anchor 20, which is electrically attached to the second conducting layer 16 on the MEMS vibrating structure 10 through the second conducting layer 16 on the second mechanical support member 22. Alternate embodiments of the present invention may use other mechanisms for coupling the driving AC signal to the MEMS vibrating structure 10, such as wire bonding. The driving AC signal may be sinusoidal or may be a periodic waveform of any shape. In alternate embodiments of the present invention, the MEMS vibrating structure 10 may be of any shape, such as a bar, a ring, or a square.

The first conducting layer 14 may be a metallization layer, which may include Chromium or other metal, and the second conducting layer 16 may be a metallization layer, which may include Chromium or other metal. The thickness of the grown single-crystal piezoelectric thin-film layer 12 in the MEMS vibrating structure 10 may be less than about five micrometers. In a first exemplary embodiment of the present invention, the thickness of the grown single-crystal piezoelectric thin-film layer 12 in the MEMS vibrating structure 10 may be less than about one micro-meter.

The grown single-crystal piezoelectric thin film layer 12 in the MEMS vibrating structure 10 may include Lithium Tantalate, Lithium Niobate, quartz, or any combination thereof. The substrate 26 may include Lithium Tantalate, Lithium Niobate, quartz, Silicon, Gallium Arsenide, or any combination thereof. A motional impedance presented between the first and second conducting layers 14, 16 may be less than about 100 ohms at a first frequency. In an exemplary embodiment of the present invention, the motional impedance presented between the first and second conducting layers 14, 16 may be less than about 50 ohms at a first frequency.

FIG. 2 is a graph illustrating how the MEMS vibrating structure diameter 28 varies with time. In the present invention, during a first active state, the MEMS vibrating structure 10 vibrates with dominant lateral vibrations, or a lateral dominant mode of vibration. Since the MEMS vibrating structure 10 is in the shape of a disk, the dominant lateral vibrations may manifest themselves primarily as changing the diameter of the disk over time from a nominal value to a maximum value, back to the nominal value, to a minimum value, back to the nominal value, and so on.

Figure 3A:
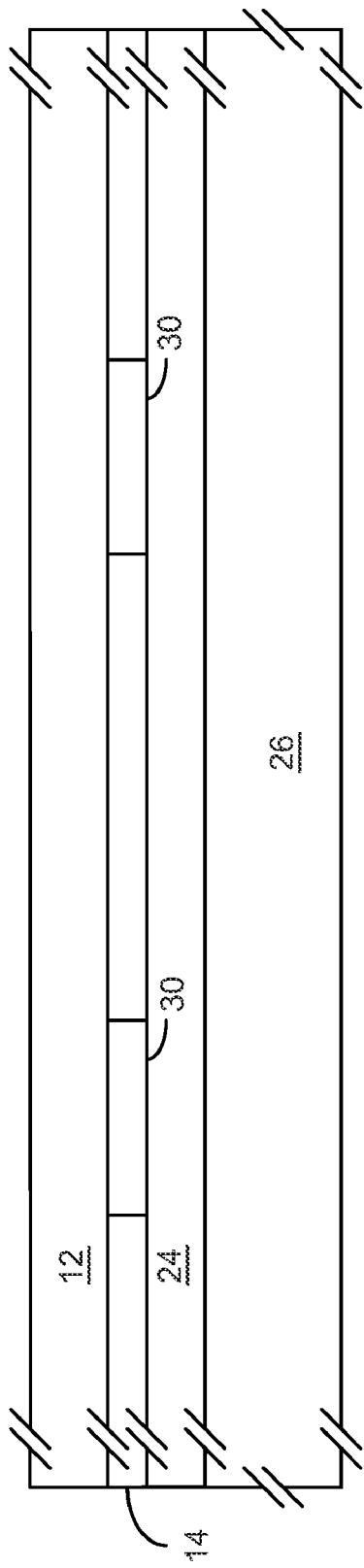

FIGS. 3A, 3B, 3C, 3D, 3E, and 3F show how the substrate 26 and its layers 24, 14, 12, 16 are used to form the MEMS vibrating structure 10 illustrated in FIG. 1. FIG. 3A illustrates the insulating layer 24 formed over the substrate 26, which may include Silicon, non-doped Silicon, Lithium Tantalate, Lithium Niobate, quartz, or any combination thereof. The insulating layer 24 may be a buried oxide layer, such as Silicon Dioxide or another proper sacrificial material, which may be deposited over the substrate 26 using low-pressure chemical vapor deposition (LPCVD), plasma-enhanced chemical vapor deposition (PECVD), or another deposition process. The insulating layer 24 may be patterned and etched at this stage (not shown), called a pre-cavity process, to avoid the need for a final oxide release step, which may simplify the overall process and improve fabrication yields.

The first conducting layer 14 is formed over the insulating layer 24, and may be a metallization layer, which may include a metal, such as Chromium. The first conducting layer 14 may be patterned and etched at this stage to form cavities 30, called a pre-cavity process, to avoid the need for further etching. The first conducting layer 14 may be used to provide bottom electrodes for the MEMS vibrating structure 10. The grown single-crystal piezoelectric thin-film layer 12 has a wafer cut with an optimized orientation and is bonded to the surface of the first conducting layer 14 using a bonding technique, such as a smart-cut bonding technique from SOITEC technology of Bernin, France, or an organic bonding and thinning process from NGK of Komaki, Japan. In one embodiment of the present invention, the first conducting layer 14 and the insulating layer 24 are added to a grown single-crystal piezoelectric wafer, which is then attached to the substrate 26. The grown single-crystal piezoelectric thin-film layer 12 is produced using a thinning process, which reduces the thickness of the grown single-crystal piezoelectric wafer. Cavities 30 may be pre-formed in the first conducting layer 14.

Figure 3B:
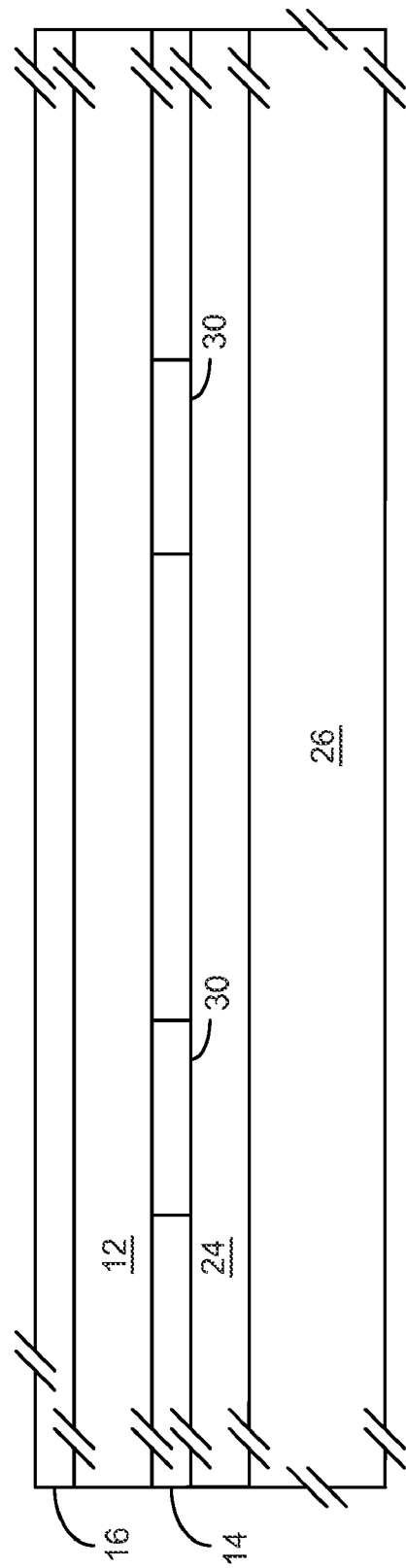

The second conducting layer 16 is formed over the grown single-crystal piezoelectric thin-film layer 12, and may be a metallization layer, which may include a metal, such as Chromium, as illustrated in FIG. 3B. The second conducting layer 16 may be patterned and etched to provide top electrodes for the MEMS vibrating structure 10, as illustrated in FIG. 3C. The grown single-crystal piezoelectric thin-film layer 12 may be patterned and etched to form the sides of the MEMS vibrating structure 10 using a dry etch technique, such as a Sulfur Hexafluoride based reactive ion etching (RIE) process, as illustrated in FIG. 3D. The dotted lines indicate the presence of the first and second mechanical support members 19, 22. If the cavities 30 were not previously formed in the first conducting layer 14 (not shown), the first conducting layer 14 may be patterned and etched to further form the sides of the MEMS vibrating structure 10. The grown single-crystal piezoelectric thin-film layer 12 may be patterned and etched to access the bottom electrodes for the MEMS vibrating structure 10, as illustrated in FIG. 3E. A solution of Hydrogen Fluoride (HF) may be used to remove buried oxide underneath the MEMS vibrating structure 10, such that the only remaining mechanical connections to the MEMS vibrating structure 10 are from the first and second mechanical support members 19, 22, as illustrated in FIG. 3F.

The MEMS vibrating structure 10 illustrated in FIG. 1 may be fabricated using any number of different processes, all of which are within the scope of the present invention. A first embodiment of the MEMS vibrating structure 10 in its simplest form includes the grown single-crystal piezoelectric thin-film layer 12 sandwiched between the first conducting layer 14 and the second conducting layer 16, such that the grown single-crystal piezoelectric thin-film layer 12 is the principal resonating layer.

FIG. 4 shows a MEMS vibrating structure 10 according to a second embodiment of the present invention. The MEMS vibrating structure 10 illustrated in FIG. 4 differs from the MEMS vibrating structure 10 illustrated in FIG. 1 in several ways. In FIG. 1, the grown single-crystal piezoelectric thin-film layer 12 provides most of the mechanical support in the first and second mechanical support members 19, 22, whereas in FIG. 4, the first conducting layer 14 provides most of the mechanical support in the first and second mechanical support members 19, 22.

In FIG. 4, the first conducting layer 14 is the principal resonating layer and may provide the dominant resonant characteristics of the MEMS vibrating structure 10. The first conducting layer 14 may be a single-crystal semiconductor layer, such as Silicon, doped Silicon, highly-doped Silicon, or any combination thereof. Alternatively, the first conducting layer 14 may include polysilicon, isotropic, or other materials. The first conducting layer 14 may be thick when compared with the grown single-crystal piezoelectric thin-film layer 12. For example, in an exemplary embodiment of the present invention, the thickness of the first conducting layer 14 may be less than about ten micro-meters, whereas the thickness of the grown single-crystal piezoelectric thin-film layer 12 may be less than about 0.1 micro-meters. The grown single-crystal piezoelectric thin-film layer 12 serves as a driving transducer, whereas the first conducting layer 14 provides a structural film and serves as the primary vibrating resonant structure. Such a MEMS vibrating structure 10 may take advantage of the benefits of single-crystal Silicon, which may include high stability, high-Q, high linearity, low loss, and high acoustic-velocity.

The grown single-crystal piezoelectric thin-film layer 12 may function as both a piezoelectric transducer and an electrostatic transducer. The piezoelectric transducer responds to the driving AC voltage between the first and second conducting layers 14, 16 by generating lateral vibrations in the grown single-crystal piezoelectric thin-film layer 12, which may mechanically couple the lateral vibrations to the single-crystal Silicon first conducting layer 14. The lateral vibrations may be caused by a piezoelectric effect produced by the driving AC voltage. The piezoelectric effect may present a piezoelectric impedance between the first and second conducting layers 14, 16. The electrostatic transducer responds to a DC voltage together with AC voltage applied between the first and second conducting layers 14, 16 and lateral vibrations in the grown single-crystal piezoelectric thin-film layer 12. The lateral vibrations and DC voltage may produce an electrostatic effect, which may present an electrostatic impedance between the first and second conducting layers 14, 16. An electrostatic force may be about proportional to a product of the AC voltage and the DC voltage.

The thinness of the grown single-crystal piezoelectric thin-film layer 12 when compared with the thickness of the first conducting layer 14 may allow a very high density electric field for a given applied DC voltage. This very high density electric field combined with the stiffness and piezoelectric constants enabled by the mechanical coupling of the grown single-crystal piezoelectric thin-film layer 12 to the single-crystal Silicon first conducting layer 14 may produce previously unrealizable interactions between a combined piezoelectric transducer and electrostatic transducer.

The grown single-crystal piezoelectric thin-film layer 12 is a single-crystal layer that may have been cut from a wafer that was grown with a specific crystal orientation. Additionally, the single-crystal Silicon first conducting layer 14 may be a single-crystal layer that may have been cut from a wafer that was grown with a specific crystal orientation. The wafer cuts, such as Z-cut or rotated Y-cut, the shapes, and the thicknesses of the grown single-crystal piezoelectric thin-film layer 12 and the single-crystal Silicon first conducting layer 14 in the MEMS vibrating structure 10 may determine its vibrational characteristics. The wafer materials also may determine vibrational characteristics. Different vibrational characteristics may be used for different applications, such as sensors, resonators, oscillators, or filters.

One vibrational characteristic is resonant frequency. The bonded grown single-crystal piezoelectric thin-film layer 12 to the single-crystal Silicon first conducting layer 14 in the MEMS vibrating structure 10 may form a vibrating substructure having at least one resonant region, which has at least one resonant frequency. Other vibrational characteristics are electromechanical coupling coefficients, which relate the mechanical to electrical characteristics of the MEMS vibrating structure 10, and may be useful for RF filter applications or high-Q RF circuits.

Figure 5A:
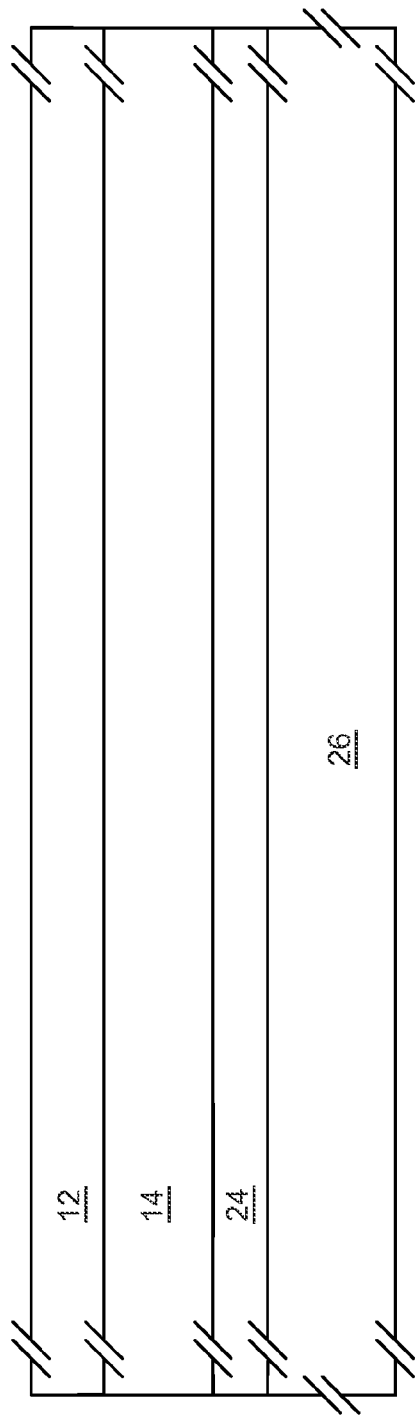

FIGS. 5A, 5B, 5C, 5D, 5E, and 5F show how the substrate 26 and its layers 24, 14, 12, 16 are used to form the MEMS vibrating structure 10 illustrated in FIG. 4. FIG. 5A illustrates the insulating layer 24 formed over the substrate 26, which may include Silicon, non-doped Silicon, Lithium Tantalate, Lithium Niobate, quartz, or any combination thereof. The insulating layer 24 may be a buried oxide layer, such as Silicon Dioxide or another proper sacrificial material, which may be deposited over the substrate 26 using LPCVD, PECVD, or another deposition process. The insulating layer 24 may be patterned and etched at this stage (not shown), called a pre-cavity process, to avoid the need for a final oxide release step, which may simplify the overall process and improve fabrication yields. The first conducting layer 14 is formed over the insulating layer 24, and may be a metallization layer, which may include a metal, such as Chromium; however, since the first conducting layer 14 is the principal resonating layer in the second embodiment of the present invention, the first conducting layer 14 is typically a semiconductor material, such as Silicon. The first conducting layer 14 may be used to provide bottom electrodes for the MEMS vibrating structure 10.

In one embodiment of the present invention, the substrate 26, the insulating layer 24, and the first conducting layer 14 are provided by a Silicon-on-insulator wafer, wherein the substrate 26 may be a Silicon substrate, the insulating layer 24 may include buried oxide, such as Silicon Dioxide or Sapphire, and the first conducting layer 14 may include highly-doped Silicon for high conductivity. The grown single-crystal piezoelectric thin-film layer 12 that has a wafer cut with an optimized orientation is bonded to the surface of the first conducting layer 14 using a bonding technique, such as a smart-cut bonding technique from SOITEC technology of Bernin, France, or an organic bonding and thinning process from NGK of Komaki, Japan.

Figure 5B:
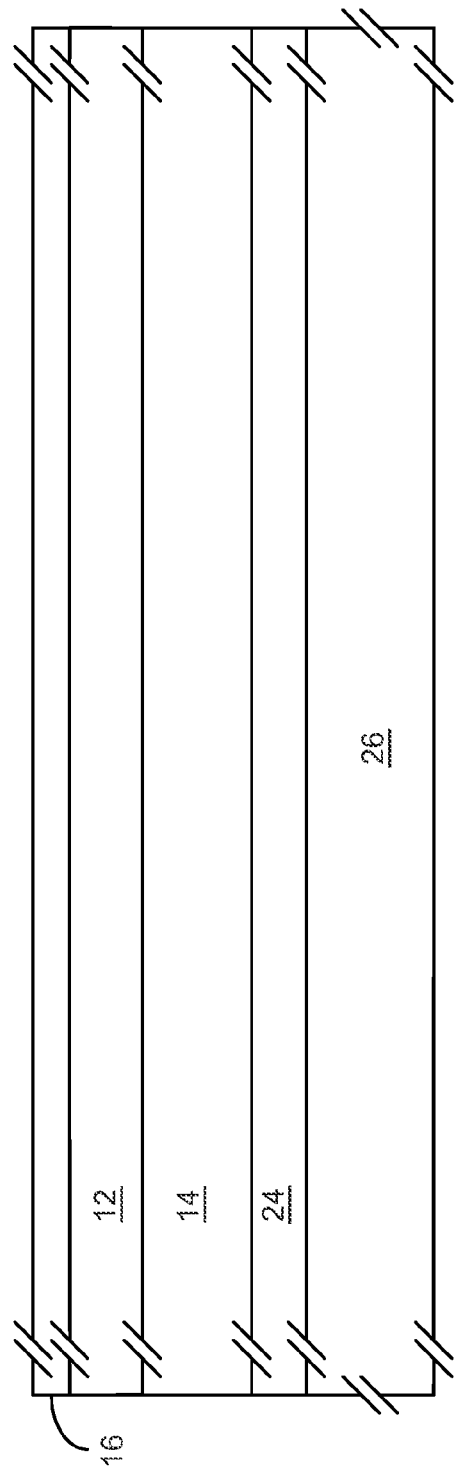

The second conducting layer 16 is formed over the grown single-crystal piezoelectric thin-film layer 12, and may be a metallization layer, which may include a metal, such as Chromium, as illustrated in FIG. 5B. The second conducting layer 16 may be patterned and etched to provide top electrodes for the MEMS vibrating structure 10, as illustrated in FIG. 5C. The grown single-crystal piezoelectric thin-film layer 12 may be patterned and etched to form the sides of the MEMS vibrating structure 10 using a dry etch technique, such as a Sulfur Hexafluoride based RIE process, as illustrated in FIG. 5D. The first conducting layer 14 may be patterned and etched to further form the sides of the MEMS vibrating structure 10, and to access the bottom electrodes for the MEMS vibrating structure 10, as illustrated in FIG. 5E. The dotted lines indicate the presence of the first and second mechanical support members 19, 22. A solution of HF may be used to remove buried oxide underneath the MEMS vibrating structure 10, such that the only remaining mechanical connections to the MEMS vibrating structure 10 are from the first and second mechanical support members 19, 22, as illustrated in FIG. 5F.

The MEMS vibrating structure 10 illustrated in FIG. 4 may be fabricated using any number of different processes, all of which are within the scope of the present invention. A second embodiment of the MEMS vibrating structure 10 in its simplest form includes the grown single-crystal piezoelectric thin-film layer 12 sandwiched between the first conducting layer 14 and the second conducting layer 16, such that the first conducting layer 14 is the principal resonating layer. Additional embodiments of the present invention may include the grown single-crystal piezoelectric thin-film layer 12 over the second conducting layer 16 and the first conducting layer 14 over the grown single-crystal piezoelectric thin-film layer 12.

FIG. 6 shows a MEMS vibrating structure 10 according to a third embodiment of the present invention. The MEMS vibrating structure 10 illustrated in FIG. 6 differs from the MEMS vibrating structure 10 illustrated in FIG. 1 in several ways. In FIG. 1, the grown single-crystal piezoelectric thin-film layer 12 is sandwiched between the first conducting layer 14 and the second conducting layer 16. The MEMS vibrating structure 10 illustrated in FIG. 6 includes an additional layer 31 when compared with the MEMS vibrating structure 10 illustrated in FIG. 1. In FIG. 1, the grown single-crystal piezoelectric thin-film layer 12 provides most of the mechanical support in the first and second mechanical support members 19, 22, whereas in FIG. 6, either the grown single-crystal piezoelectric thin-film layer 12, the additional layer 31, or both provide most of the mechanical support in the first and second mechanical support members 19, 22. Similarly, either the grown single-crystal piezoelectric thin-film layer 12 or the additional layer 31 may be the principal resonating layer, or both the grown single-crystal piezoelectric thin-film layer 12 and the additional layer 31 may provide the dominant resonant characteristics of the MEMS vibrating structure 10.

The additional layer 31 may be located over the insulating layer 24, and the first conducting layer 14 may be located over the additional layer 31. The additional layer 31 may be conducting, non-conducting, or semiconducting. The additional layer 31 may be a single-crystal semiconductor layer, such as Silicon, doped Silicon, highly-doped Silicon, or any combination thereof. Alternatively, the additional layer 31 may include polysilicon, isotropic, or other materials. The additional layer 31 may be thick when compared with the grown single-crystal piezoelectric thin-film layer 12. For example, in an exemplary embodiment of the present invention, the thickness of the additional layer 31 may be less than about ten micro-meters, whereas the thickness of the grown single-crystal piezoelectric thin-film layer 12 may be less than about 0.1 micro-meters. The grown single-crystal piezoelectric thin-film layer 12 serves as a driving transducer, whereas the additional layer 31 may provide a structural film and may serve as the primary vibrating resonant structure. Such a MEMS vibrating structure 10 may take advantage of the benefits of non-conducting materials, which may include high stability, high-Q, high linearity, low loss, and high acoustic-velocity.

The grown single-crystal piezoelectric thin-film layer 12 may function as both a piezoelectric transducer and an electrostatic transducer. The piezoelectric transducer responds to the driving AC voltage between the first and second conducting layers 14, 16 by generating lateral vibrations in the grown single-crystal piezoelectric thin-film layer 12, which may mechanically couple the lateral vibrations to the additional layer 31. The lateral vibrations may be caused by a piezoelectric effect produced by the driving AC voltage. The piezoelectric effect may present a piezoelectric impedance between the first and second conducting layers 14, 16. The electrostatic transducer responds to a DC voltage together with AC voltage applied between the first and second conducting layers 14, 16 and lateral vibrations in the grown single-crystal piezoelectric thin-film layer 12. The lateral vibrations and the DC voltage may produce an electrostatic effect, which may present an electrostatic impedance between the first and second conducting layers 14, 16. An electrostatic force may be about proportional to a product of the AC voltage and the DC voltage.

The thinness of the grown single-crystal piezoelectric thin-film layer 12 when compared with the thickness of the additional layer 31 may allow a very high density electric field for a given applied DC voltage. This very high density electric field combined with the stiffness and piezoelectric constants enabled by the mechanical coupling of the grown single-crystal piezoelectric thin-film layer 12 to the additional layer 31 may produce previously unrealizable interactions between a combined piezoelectric transducer and electrostatic transducer.

The grown single-crystal piezoelectric thin-film layer 12 is a single-crystal layer that may have been cut from a wafer that was grown with a specific crystal orientation. Additionally, the additional layer 31 may be a single-crystal layer that may have been cut from a wafer that was grown with a specific crystal orientation. The wafer cuts, such as Z-cut or rotated Y-cut, the shapes, and the thicknesses of the grown single-crystal piezoelectric thin-film layer 12 and the additional layer 31 in the MEMS vibrating structure 10 may determine its vibrational characteristics. The wafer materials also may determine vibrational characteristics. Different vibrational characteristics may be used for different applications, such as sensors, resonators, oscillators, or filters.

One vibrational characteristic is resonant frequency. The grown single-crystal piezoelectric thin-film layer 12 attached to the additional layer 31 using the first conducting layer 14 in the MEMS vibrating structure 10 may form a vibrating substructure having at least one resonant region, which has at least one resonant frequency. Other vibrational characteristics are electromechanical coupling coefficients, which relate the mechanical to electrical characteristics of the MEMS vibrating structure 10, and may be useful for RF filter applications or high-Q RF circuits.

The MEMS vibrating structure 10 illustrated in FIG. 6 may be fabricated using any number of different processes, all of which are within the scope of the present invention. A third embodiment of the MEMS vibrating structure 10 in its simplest form includes the grown single-crystal piezoelectric thin-film layer 12 sandwiched between the first conducting layer 14 and the second conducting layer 16, and an additional layer 31 attached to either the first conducting layer 14 or the second conducting layer 16. The grown single-crystal piezoelectric thin-film layer 12 may be the principal resonating layer, the additional layer 31 may be the principal resonating layer, or both the grown single-crystal piezoelectric thin-film layer 12 and the additional layer 31 may provide the principal resonating characteristics of the MEMS vibrating structure 10.

FIG. 7 shows a MEMS vibrating structure 10 according to an additional embodiment of the present invention. The second conducting layer 16 provides a first conducting section 32 on part of the first anchor 18, on the first mechanical support member 19, and on part of the MEMS vibrating structure 10.

The second conducting layer 16 provides a second conducting section 34 on the second anchor 20, on the second mechanical support member 22, and on part of the MEMS vibrating structure 10. On the first anchor 18, the second conducting layer 16 and the grown single-crystal piezoelectric thin-film layer 12 may be etched away to provide an electrical connection to the first conducting layer 14. The first conducting layer 14, the first conducting section 32, and the second conducting section 34 may be electrically isolated from one another. A MEMS vibrating structure 10 having multiple segments may be called an inter-digital transducer (IDT).

FIG. 8 shows a top view of the MEMS vibrating structure 10 illustrated in FIG. 7. The first and second conducting sections 32, 34 segment the MEMS vibrating structure 10 into a first segment 36, a second segment 38, and a third segment 40. Each of the first, second, and third segments 36, 38, 40 is rectangular in shape with the first conducting section 32 providing a first conducting finger 42 down the center of the first segment 36 and a second conducting finger 44 down the center of the second segment 38, and the second conducting section 34 providing a third conducting finger 46 down the center of the third segment 40. Normally, a first AC voltage is applied between the first conducting layer 14 and the first conducting section 32, and a second AC voltage, which is phase-shifted about 180 degrees from the first AC voltage, is applied between the first conducting layer 14 and the second conducting section 34. Therefore, the voltages surrounding the first and second segments 36, 38 are phase-shifted about 180 degrees from the voltage surrounding the third segment 40, which drives the first and second segments 36, 38 in directions that are opposite to the direction of the third segment 40.

For example, when the first and second segments 36, 38 are being driven to minimize the widths of the first and second segments 36, 38, the third segment 40 is being driven to maximize the width of the third segment 40, as illustrated in FIGS. 9A, 9B, and 9C. By sub-dividing the MEMS vibrating structure 10 into segments, each segment may vibrate at a higher frequency than an un-segmented MEMS vibrating structure 10. The higher frequencies may be better suited for certain RF applications. Alternate embodiments of the present invention may use any number of segments of any shape. The first and second AC voltages may be sinusoidal or may be periodic waveforms of any shape.

The MEMS vibrating structures 10 illustrated in FIG. 1, FIG. 4, and FIG. 6 are examples of single-port disk resonators. The MEMS vibrating structure 10 illustrated in FIG. 8 is an example of a dual-port IDT resonator. In alternate embodiments of the present invention, the MEMS vibrating structure 10 may be of any shape, such as a bar, a ring, or a square, may be a single-port resonator, may be a dual-port resonator, or any combination thereof. The MEMS vibrating structures 10 illustrated in FIG. 1, FIG. 4, FIG. 6, and FIG. 8 are shown with the grown single-crystal piezoelectric thin-film layer 12 sandwiched between the first conducting layer 14 and the second conducting layer 16. The single-crystal piezoelectric thin-film layer 12 provides a body of the MEMS vibrating structure 10. In alternate embodiments of the present invention, the body of the MEMS vibrating structure 10 may include the single-crystal piezoelectric thin-film layer 12 and one or more additional layers of any material in any arrangement.

An application example of a MEMS vibrating structure 10 is its use in a filter circuit 48 in a mobile terminal 50, the basic architecture of which is represented in FIG. 10. The mobile terminal 50 may include a receiver front end 52, a radio frequency transmitter section 54, an antenna 56, a duplexer or switch 58, a baseband processor 60, a control system 62, a frequency synthesizer 64, and an interface 66. The receiver front end 52 receives information bearing radio frequency signals from one or more remote transmitters provided by a base station (not shown). A low noise amplifier (LNA) 68 amplifies the signal. The filter circuit 48 minimizes broadband interference in the received signal, while down conversion and digitization circuitry 70 down converts the filtered, received signal to an intermediate or baseband frequency signal, which is then digitized into one or more digital streams. The receiver front end 52 typically uses one or more mixing frequencies generated by the frequency synthesizer 64. The baseband processor 60 processes the digitized received signal to extract the information or data bits conveyed in the received signal. This processing typically comprises demodulation, decoding, and error correction operations. As such, the baseband processor 60 is generally implemented in one or more digital signal processors (DSPs).

On the transmit side, the baseband processor 60 receives digitized data, which may represent voice, data, or control information, from the control system 62, which it encodes for transmission. The encoded data is output to the transmitter 54, where it is used by a modulator 72 to modulate a carrier signal that is at a desired transmit frequency. Power amplifier circuitry 74 amplifies the modulated carrier signal to a level appropriate for transmission, and delivers the amplified and modulated carrier signal to the antenna 56 through the duplexer or switch 58.

A user may interact with the mobile terminal 50 via the interface 66, which may include interface circuitry 76 associated with a microphone 78, a speaker 80, a keypad 82, and a display 84. The interface circuitry 76 typically includes analog-to-digital converters, digital-to-analog converters, amplifiers, and the like. Additionally, it may include a voice encoder/decoder, in which case it may communicate directly with the baseband processor 60. The microphone 78 will typically convert audio input, such as the user's voice, into an electrical signal, which is then digitized and passed directly or indirectly to the baseband processor 60. Audio information encoded in the received signal is recovered by the baseband processor 60, and converted by the interface circuitry 76 into an analog signal suitable for driving the speaker 80. The keypad 82 and display 84 enable the user to interact with the mobile terminal 50, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A vibrating micro-electro-mechanical circuit comprising:
    a substrate having a substrate surface;
    a first anchor on the substrate surface;
    a second anchor on the substrate surface; and
    a micro-electro-mechanical systems (MEMS) vibrating structure comprising:
        a body:
            suspended between the first anchor and the second anchor; and
            comprising:
                a first surface and a second surface that are about parallel to the substrate surface; and
                a single-crystal piezoelectric thin-film having a substantially uniform crystalline orientation;
        a first conducting section residing on the first surface of the body; and
        a second conducting section residing on the second surface of the body, such that the MEMS vibrating structure has dominant lateral vibrations that are about parallel to the substrate surface when a first electrical signal is applied to the first conducting section and the second conducting section.

2. The vibrating micro-electro-mechanical circuit of claim 1 wherein the single-crystal piezoelectric thin-film provides the dominant lateral vibrations.

3. The vibrating micro-electro-mechanical circuit of claim 2 wherein the dominant lateral vibrations are based on a direction of a cut of growth of the single-crystal piezoelectric thin-film.

4. The vibrating micro-electro-mechanical circuit of claim 1 wherein the first conducting section provides the dominant lateral vibrations.

5. The vibrating micro-electro-mechanical circuit of claim 4 wherein the first conducting section is a single-crystal conducting section and the dominant lateral vibrations are based on a direction of a cut of growth of the first conducting section.

6. The vibrating micro-electro-mechanical circuit of claim 4 wherein the first conducting section comprises at least one of polysilicon, isotropic material, and other material.

7. The vibrating micro-electro-mechanical circuit of claim 1 wherein the single-crystal piezoelectric thin-film and the first conducting section provide the dominant lateral vibrations.

8. The vibrating micro-electro-mechanical circuit of claim 1 wherein:
    the first conducting section comprises a third surface that is about parallel to the substrate surface;
    the MEMS vibrating structure further comprises an additional section residing on the third surface of the first conducting section; and
    the additional section provides the dominant lateral vibrations.

9. The vibrating micro-electro-mechanical circuit of claim 8 wherein the additional section is a single-crystal additional section and the dominant lateral vibrations are based on a direction of a cut of growth of the additional section.

10. The vibrating micro-electro-mechanical circuit of claim 1 wherein:
    the first conducting section comprises a third surface that is about parallel to the substrate surface;
    the MEMS vibrating structure further comprises an additional section residing on the third surface of the first conducting section; and
    the single-crystal piezoelectric thin-film and the additional section provide the dominant lateral vibrations.

11. The vibrating micro-electro-mechanical circuit of claim 1 wherein:
    the first conducting section is formed using a first conducting layer;
    the second conducting section is formed using a second conducting layer; and
    the single-crystal piezoelectric thin-film is formed using a single-crystal piezoelectric thin-film layer.

12. The vibrating micro-electro-mechanical circuit of claim 11 wherein:
    the first conducting section comprises a third surface that is about parallel to the substrate surface;
    the MEMS vibrating structure further comprises an additional section residing on the third surface of the first conducting section; and
    the additional section is formed using an additional layer.

13. The vibrating micro-electro-mechanical circuit of claim 11 wherein the first conducting layer is a metallization layer.

14. The vibrating micro-electro-mechanical circuit of claim 11 wherein the first conducting layer is a semiconductor layer.

15. The vibrating micro-electro-mechanical circuit of claim 14 wherein the first conducting layer is a single-crystal semiconductor layer.

16. The vibrating micro-electro-mechanical circuit of claim 15 wherein the first conducting layer comprises highly-doped Silicon.

17. The vibrating micro-electro-mechanical circuit of claim 11 further comprising:
   a first mechanical support member between the first anchor and the MEMS vibrating structure; and
   a second mechanical support member between the second anchor and the MEMS vibrating structure.

18. The vibrating micro-electro-mechanical circuit of claim 17 wherein:
   the first conducting layer provides an electrical connection from the first anchor across the first mechanical support member to the first conducting section; and
   the second conducting layer provides an electrical connection from the second anchor across the second mechanical support member to the second conducting section.

19. The vibrating micro-electro-mechanical circuit of claim 1 wherein the first electrical signal comprises an alternating current (AC) voltage between the first conducting section and the second conducting section.

20. The vibrating micro-electro-mechanical circuit of claim 19 wherein the dominant lateral vibrations are caused by a piezoelectric effect based on the AC voltage.

21. The vibrating micro-electro-mechanical circuit of claim 19 wherein the first electrical signal further comprises a direct current (DC) voltage between the first conducting section and the second conducting section.

22. The vibrating micro-electro-mechanical circuit of claim 21 wherein the dominant lateral vibrations are caused by an electrostatic transducer effect based on the DC voltage and the AC voltage, and a piezoelectric transducer effect based on the AC voltage.

23. The vibrating micro-electro-mechanical circuit of claim 1 further comprising a third conducting section residing on the second surface of the body, such that the MEMS vibrating structure has the dominant lateral vibrations that are about parallel to the substrate surface when the first electrical signal is applied to the first conducting section and the second conducting section, and a second electrical signal is applied to the first conducting section and the third conducting section.

24. The vibrating micro-electro-mechanical circuit of claim 23 wherein:
   the first electrical signal comprises a first alternating current (AC) voltage between the first conducting section and the second conducting section; and
   the second electrical signal comprises a second AC voltage between the first conducting section and the third conducting section.

25. The vibrating micro-electro-mechanical circuit of claim 24 wherein:
   the first electrical signal further comprises a direct current (DC) voltage between the first conducting section and the second conducting section; and
   the second electrical signal further comprises the DC voltage between the first conducting section and the third conducting section.

26. The vibrating micro-electro-mechanical circuit of claim 24 wherein the first AC voltage is phase-shifted from the second AC voltage by about 180 degrees.

27. The vibrating micro-electro-mechanical circuit of claim 1 further comprising at least one anchor on the substrate surface, wherein the body is further suspended between the first anchor, the second anchor, and the at least one anchor.

* * * * *